United States Patent
Raimondi et al.

(10) Patent No.: US 10,615,784 B2
(45) Date of Patent: Apr. 7, 2020

(54) PWM MODULATOR

(71) Applicant: STMicroelectronics S.r.l., Agrate Brianza (IT)

(72) Inventors: Marco Raimondi, Busto Garolfo (IT); Edoardo Botti, Vigevano (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/031,773

(22) Filed: Jul. 10, 2018

(65) Prior Publication Data
US 2018/0323774 A1    Nov. 8, 2018

Related U.S. Application Data

(62) Division of application No. 15/431,374, filed on Feb. 13, 2017, now Pat. No. 10,027,315, which is a
(Continued)

(30) Foreign Application Priority Data

Jan. 17, 2014    (IT) .............................. MI2014A0055

(51) Int. Cl.
| | |
|---|---|
| H03K 5/01 | (2006.01) |
| H03K 5/1252 | (2006.01) |
| H03F 1/26 | (2006.01) |
| H03F 1/32 | (2006.01) |
| H03F 3/217 | (2006.01) |
| H03K 7/08 | (2006.01) |
| H03K 5/12 | (2006.01) |
| H03K 4/08 | (2006.01) |

(52) U.S. Cl.
CPC ............. *H03K 5/1252* (2013.01); *H03F 1/26* (2013.01); *H03F 1/32* (2013.01); *H03F 3/217* (2013.01); *H03K 4/08* (2013.01); *H03K 5/01* (2013.01); *H03K 5/12* (2013.01); *H03K 7/08* (2013.01)

(58) Field of Classification Search
CPC .. H03K 5/01; H03K 7/08; H03K 5/02; H03K 5/12; H03K 5/1252; H03K 4/08; H03F 1/26; H03F 1/32; H03F 3/217; H03F 1/3241
See application file for complete search history.

(56) References Cited

U.S. PATENT DOCUMENTS

| | | |
|---|---|---|
| 6,016,075 A | 1/2000 | Hamo |
| 6,307,431 B1 | 10/2001 | Botti et al. |

(Continued)

OTHER PUBLICATIONS

Adduci et al., "PWM Power Audio Amplifier With Voltage/Current Mixed Feedback for High-Efficiency Speakers," IEEE Transactions on Industrial Electronics, vol. 54, No. 2, Apr. 2007, pp. 1141-1149.
(Continued)

*Primary Examiner* — Jung Kim
(74) *Attorney, Agent, or Firm* — Slater Matsil, LLP

(57) ABSTRACT

A method is for reducing pulse skipping from a characteristic affecting a modulating signal input to an integrator of a pulse width modulation (PWM) modulator, together with a square wave carrier signal for generating a triangular waveform of the PWM modulator. The method may include creating a broad synchronous peak at vertexes of the triangular waveform output by the integrator.

21 Claims, 6 Drawing Sheets

Related U.S. Application Data division of application No. 14/592,364, filed on Jan. 8, 2015, now Pat. No. 9,595,946.

(56) References Cited

U.S. PATENT DOCUMENTS

| | | |
|---|---|---|
| 6,346,852 B1 | 2/2002 | Masini et al. |
| 7,541,869 B2 | 6/2009 | Adduci et al. |
| 7,948,281 B2 | 5/2011 | Mendenhall |
| 2006/0145755 A1* | 7/2006 | Chen .................. H03F 3/217 330/10 |
| 2008/0284508 A1 | 11/2008 | Walker et al. |
| 2010/0079207 A1 | 4/2010 | Tai |

OTHER PUBLICATIONS

Yu, et al., "A low THD analog Class D amplifier based on self-oscillating modulation with complete feedback network," IEEE International Symposium on Circuits and Systems, May 24, 2009, pp. 2729-2732.

* cited by examiner

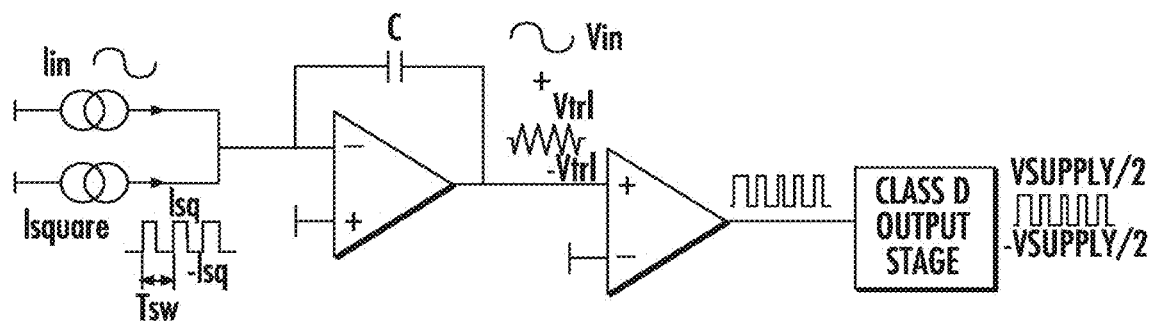
FIG. 1
(PRIOR ART)
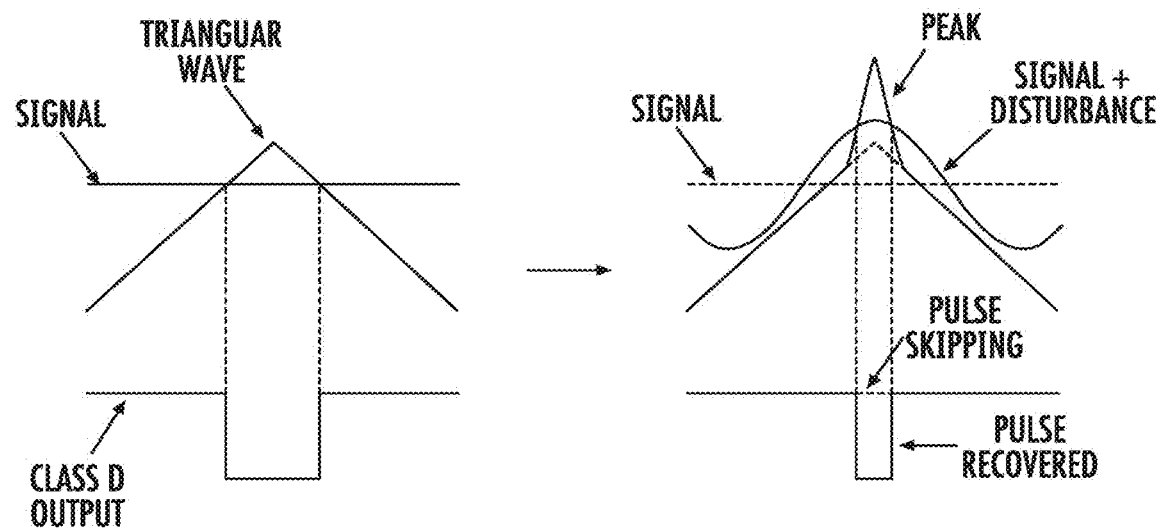
FIG. 2A  FIG. 2B

PWM MODULATOR

CROSS-REFERENCE TO RELATED APPLICATION

This application is a divisional of U.S. patent application Ser. No. 15/431,374, filed on Feb. 13, 2017, which application is a divisional of U.S. patent application Ser. No. 14/592,364 (now U.S. Pat. No. 9,595,946), filed on Jan. 8, 2015, and entitled "PWM Modulator," which application claims the benefit of Italian Patent Application No. MI20014A000055, filed on Jan. 17, 2014, which applications are hereby incorporated herein by reference.

TECHNICAL FIELD

This disclosure relates to pulse width modulation (PWM) modulators and, more particularly, to a negative feedback system employing class D amplifiers.

BACKGROUND

The functioning principle of a class D amplifier uses a carrier signal of a relatively high frequency modulated by an input signal (Iin) to be amplified, of a frequency generally much smaller than the carrier frequency, and demodulates the amplified high frequency output signal. Generally, the frequency of the carrier signal is one or more orders of magnitude greater than the frequency of the modulated input signal.

An appropriate modulation for these applications is PWM, wherein the carrier signal being modulated is a square wave (Isquare or Isq) of a fixed frequency. The duty-cycle of the square wave is modified as a function of the input signal to be amplified. This is implemented by a triangular voltage waveform (+Vtri−Vtri) generated by injecting the square wave current signal into the virtual ground node of an integrating stage of the input signal (Iin) to be amplified, and which is then fed to an input of a successive fixed threshold comparator stage to generate the PWM modulated square wave signal that is amplified by a class D output stage, as shown in the circuit diagram of FIG. 1. Notably, the information content of the input signal may then be extracted from the amplified PWM modulated signal by way of a passive low-pass LC filter (called also a demodulation filter).

SUMMARY

According to a first circuit implementation of the method of this disclosure, effective synchronous peaks are introduced by generating an auxiliary clock having a certain phase lead in respect of the clock that generates the square wave carrier signal of the PWM modulator. Hence, a derivative signal thereof with a dedicated high pass filter, characterized by sharp current peaks synchronously ahead of and immediately following the rising and falling fronts of the square wave carrier signal, is injected together with the square wave carrier signal and the modulating input signal into the input node of the op-amp integrating stage of the PWM modulator to generate at the output of the op-amp integrator a triangular wave with a pronounced and relatively broad peak at its vertex.

According to a possible alternative circuit implementation of the method of this disclosure, generation of a dedicated auxiliary clock and introduction of a dedicated high pass filter in an input line to the op-amp integrator of the PWM modulator, of a signal having sharp peaks synchronous with the fronts of the square wave carrier signal, may be avoided and with it also an undesirable increase of power consumption and risks of spurious switching in the PWM modulated output signal. According to such an alternative embodiment of simplicity, a resistor is introduced in series to the capacitor present in the feedback loop of the op-amp integrator, and the resistance is adapted to cancel the right hand side zero in the transfer function of the integrator, thus effectively eliminating or reducing a risk of spurious switching due to changes of slope in the triangular voltage waveform output by the integrator.

BRIEF DESCRIPTION OF THE DRAWINGS

FIG. 1 is a basic circuit diagram of a switching amplifier with a class D output stage, according to the prior art.

FIGS. 2A-2B illustrate the pulse skipping phenomenon caused by disturbances or oscillations when operating near saturation conditions of modulation, and how the method of this disclosure recovers the otherwise lost pulse.

DETAILED DESCRIPTION

Figure 3:
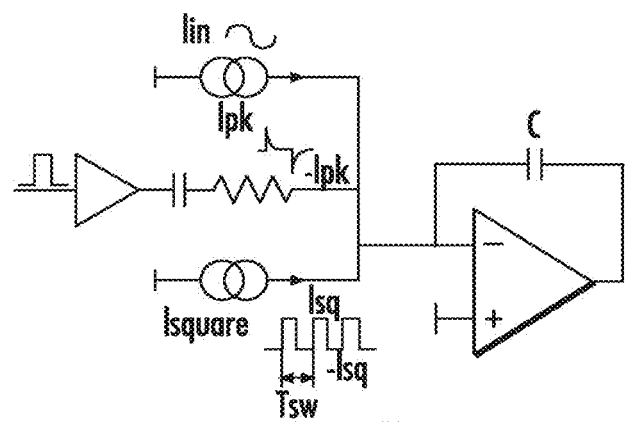
FIGS. 3 and 4 illustrate a first basic circuit implementation of the method of this disclosure of creating peaks on the vertex of the triangular waveform to overcome the pulse skipping problem, according to the present disclosure.

The ensuing description of the embodiment depicted in the drawings has solely illustrative purposes and is not to be intended as limitative of the practice of the present disclosure to the illustrated embodiments. As a matter of fact the present disclosure may be practiced with other functionally equivalent circuit structures though remaining within its scope as defined in the annexed claims.

A problem may arise when a PWM modulator approaches saturation conditions of modulation because of an exceptionally strong modulating signal (of great amplitude). In this operation condition, high frequency disturbances or oscillations may cause a phenomenon known as of "pulse skipping" earlier than the normal pulse skipping intervention, and this may lead to malfunctioning of the system with modulating signals of relatively large dynamics or when the system is exposed to strong disturbances.

An approach to the anomalous pulse skipping problem, the applicant has verified the fact that a PWM modulator in a system with negative feedback loops, like a class D amplifier, just to mention a typical example of negative feedback system, may not require that the triangular wave commonly generated by an integrator of the modulating input signal and the square wave carrier signal be very precise and specially so in the operating region near saturation of the dynamic range of modulation. Applicant has found that the anomalous pulse skipping phenomenon may be effectively countered by modifying the triangular waveform that modulates the square wave signal by adding or creating a synchronous peak on the vertex of the triangular waveform such as to prevent anomalous pulse skipping that may be caused by disturbances or oscillations when operating with a modulating input signal of an amplitude approaching the saturation limit of a comparison of the sum of the modulating input signal and of the triangular waveform with the fixed threshold of the output comparator stage of the PWM modulator.

FIG. 2A illustrates exemplary typical signal waveforms of a PWM modulator when operating near the saturation condition of modulation. When a disturbance superimposes itself on the modulating signal, it may create a situation of pulse skipping as depicted in FIG. 2B. According to the method of this disclosure, creation of a peak on the vertex of the triangular waveform (practically prolonging it) reduces or prevents the phenomenon of pulse skipping, practically recovering the pulse, that without the addition of the synchronous peak on the vertex of the triangular waveform, would be missed.

A first basic circuit implementation of the method of this disclosure of creating peaks on the vertex of the triangular waveform to overcome the pulse skipping problem is illustrated in FIG. 3. An auxiliary clock signal having a certain phase lead with respect to the clock of the generator of the square wave carrier signal is generated by ordinary circuit methods of generation of a modified clock from the main clock used for generating the square wave carrier signal.

The auxiliary clock signal fed to a logic gate and a high pass filter produces a derivative signal characterized by narrow spikes separated by an interval correspondent to the phase lead of the auxiliary clock that is injected in the input node of the op-amp integrator of the PWM modulator, together with the square wave carrier signal and the modulating input signal.

Figure 4:
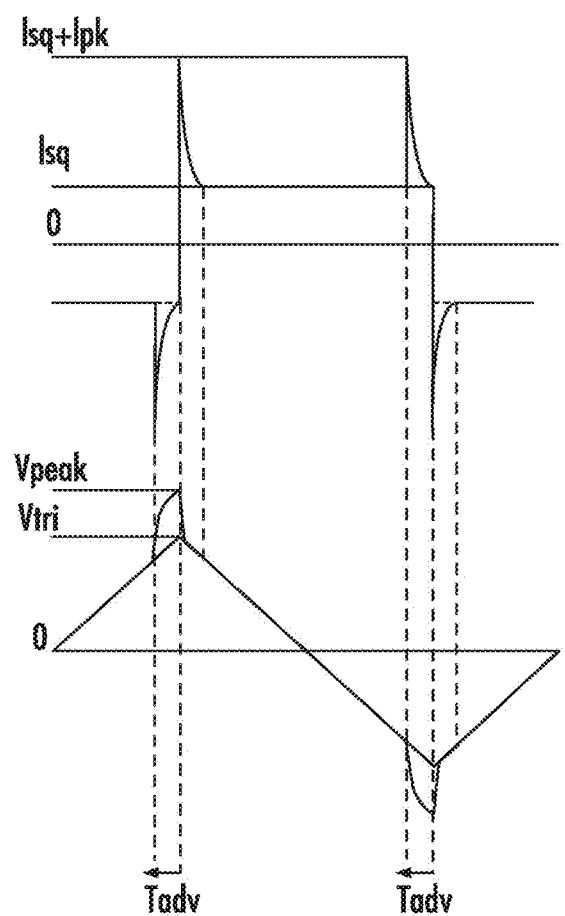
Figure 5A:
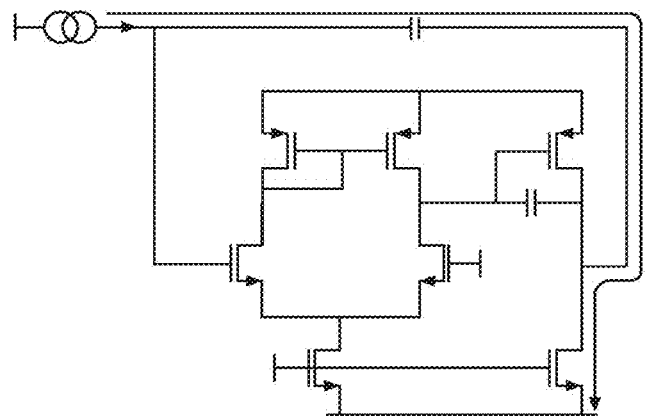
FIGS. 5A-5B show the common circuit configuration with a drain output of the op-amp of the integrator and the increment of current absorption due to the added current peaks, according to the present disclosure.
Figure 5B:
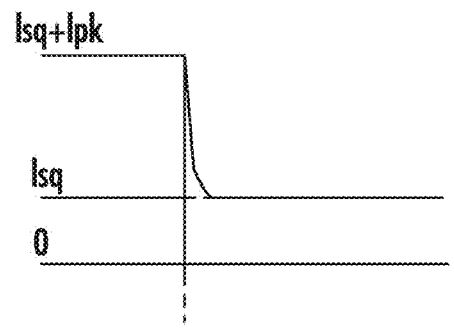

FIG. 4 shows the relevant waveforms and the resultant triangular waveform having a pronounced broad peak at the vertex of the triangular wave. The relative broadness of the peak that is created on the vertex of the triangle waveform is in this case the result of the integration that the added slender current peaks undergo in the integrating stage. The current capability of the output stage of the operational amplifier fixed by the bias current should be dimensioned not only for the square wave carrier signal but also for the current peaks added there to, as depicted in FIGS. 5A-5B.

Figure 6:
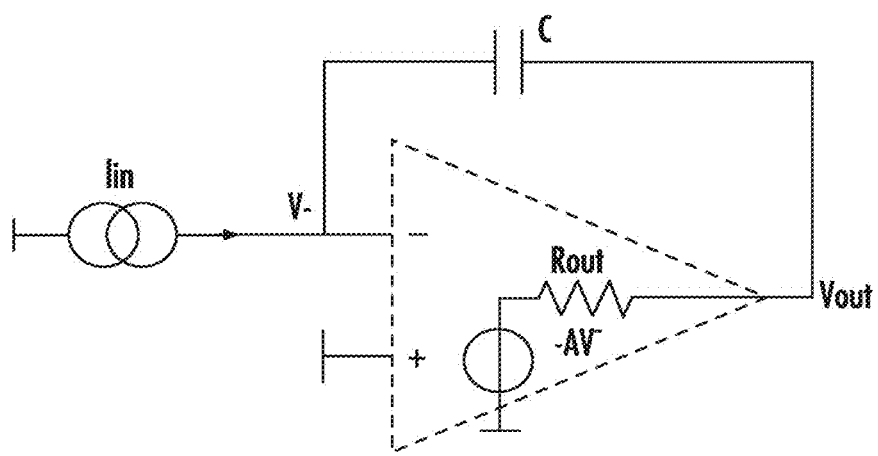
FIGS. 6 and 7 illustrate how the significantly higher output impedance of the op-amp of the integrator because of a significant back shifting of the right hand side zero of the transfer function of the op-amp integrator, introduces a risk of spurious switching, according to the present disclosure.

A high output impedance of the op-amp favors a shifting back of the right hand zero of the transfer as inferable from the transfer function of the integrator at a high frequency:

$$\frac{V_{out}}{I_{in}} = -\frac{A}{1+A} \cdot \frac{1-sCR_{out}/A}{sC} \xrightarrow{s \to \infty} \frac{R_{out}}{1+A}$$

as depicted in FIG. 6. The above discussed requisites on the intrinsic characteristics of the op-amp of the integrator may favor conditions where the addition of sharp current peaks onto the square wave carrier signal could produce abrupt slope changes in the output triangular waveform with an associated risk of spurious switching, as graphically depicted in FIG. 7. However, a proper design of the op-amp such as to lower the output impedance will render such a risk negligible.

Figure 8:
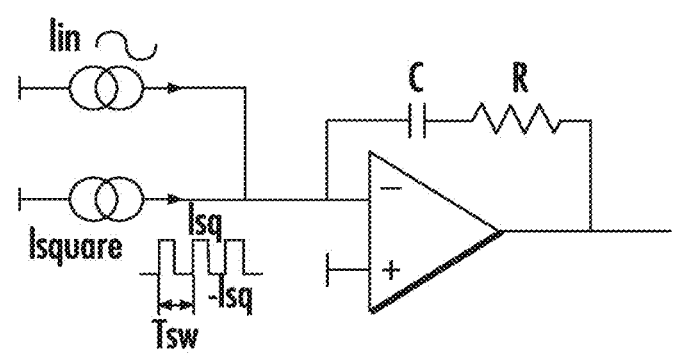
FIG. 8 illustrates a possible alternative basic embodiment of the method of this disclosure of creating peaks on the vertex of the triangular waveform to overcome the pulse skipping problem, according to the present disclosure.
Figure 9A:
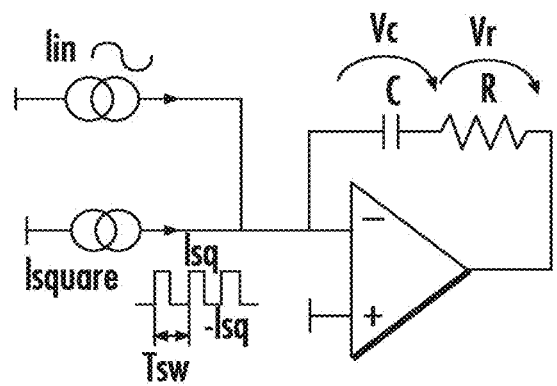
FIGS. 9A-9E illustrate the resultant waveforms of the integrator according to the circuit of FIG. 8.
Figure 9B:
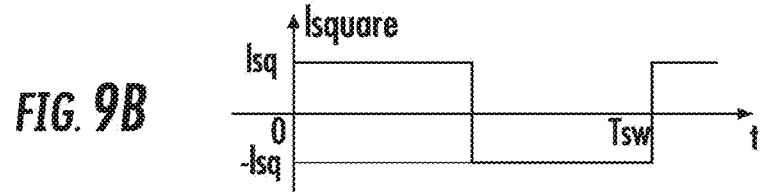
Figure 9C:
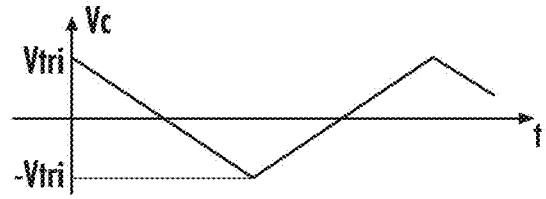
Figure 9D:
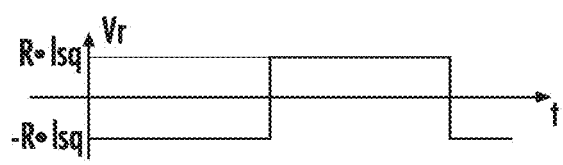
Figure 9E:
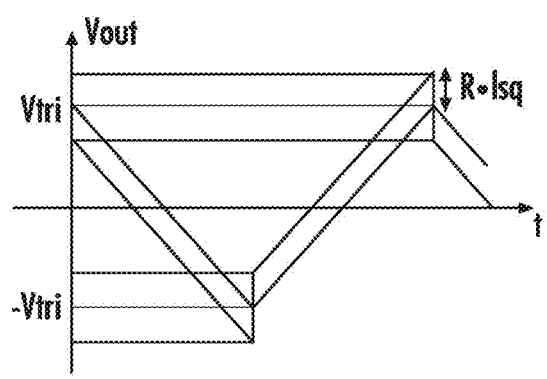

An alternative circuit implementation of the method of this disclosure is depicted in FIG. 8. This alternative approach to create a synchronous broad peak at the vertex of the triangular waveform reduces or eliminates the complication of a synchronizing auxiliary clock signal, a buffer logic gate, and a capacitor for the high pass filter of the preceding circuit embodiment, and may not impose critical design refinements of the op-amp of the integrator nor an increased bias current.

The significant waveforms of the circuit are depicted in FIGS. 9A-9E, where the basic circuit of the integrator is also reproduced without any modulating input signal to be class D amplified, to render more readily observable the characteristics of this embodiment of the PWM modulator of this disclosure. Introduction of a resistance R in series to the integrating capacitance C of the feedback loop of the op-amp integrator has the effect of making the output voltage Vout equal to the sum of the voltages Vc and Vr, respectively on the capacitor and on the resistor in the feedback loop. The Vr voltage tracks the waveform of the injected square wave carrier signal with the effect of introducing the desired peaks on the triangular waveform produced by the integration performed by the capacitance C.

The shift in opposite direction of the downward and upward slopes of the triangular waveform that creates the desired peak at the vertex has been found not to introduce any significant distortive effect of the demodulated amplified signal output by the class D amplifier and to be reliably effective in preventing early pulse skipping intervention.

In some embodiments, the value of the resistor R introduced in the feedback loop, in series with the integrating capacitor C, is chosen such as to cancel the right hand side zero in the transfer function of the op-amp integrator. In other words, the resistor introduced in the feedback loop of the op-amp integrator should have an effect similar, changing only those things that need to be changed, to that of a so called "nulling resistor" connected in series with a compensation capacitance when exploiting the Miller effect in two-stage op-amps.

Figure 10:
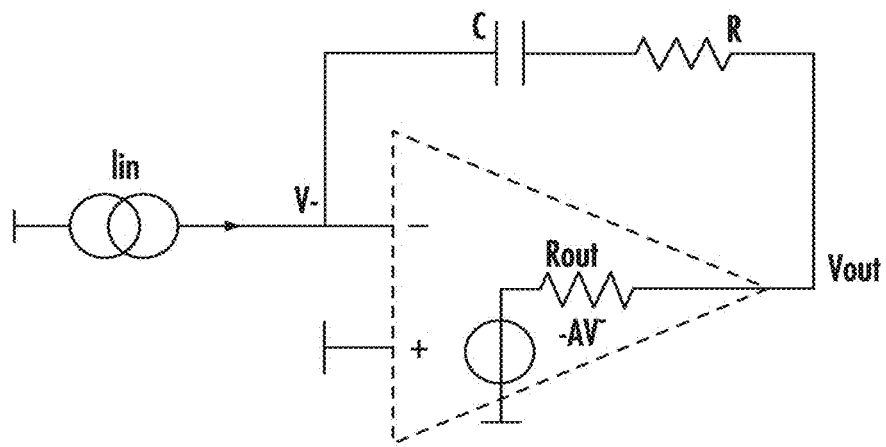
FIG. 10 shows the modified transfer function of the integrator, according to the circuit embodiment of FIG. 8.

With reference to FIG. 10, such a condition may be expressed by the relationship:

$$\frac{V_{out}}{I_{in}} = -\frac{A}{1+A} \cdot \frac{1+sC \cdot (R-R_{out}/A)}{sC} \xrightarrow{s \to \infty} -\frac{A}{1+A} \cdot (R-R_{out}/A).$$

Figure 7:
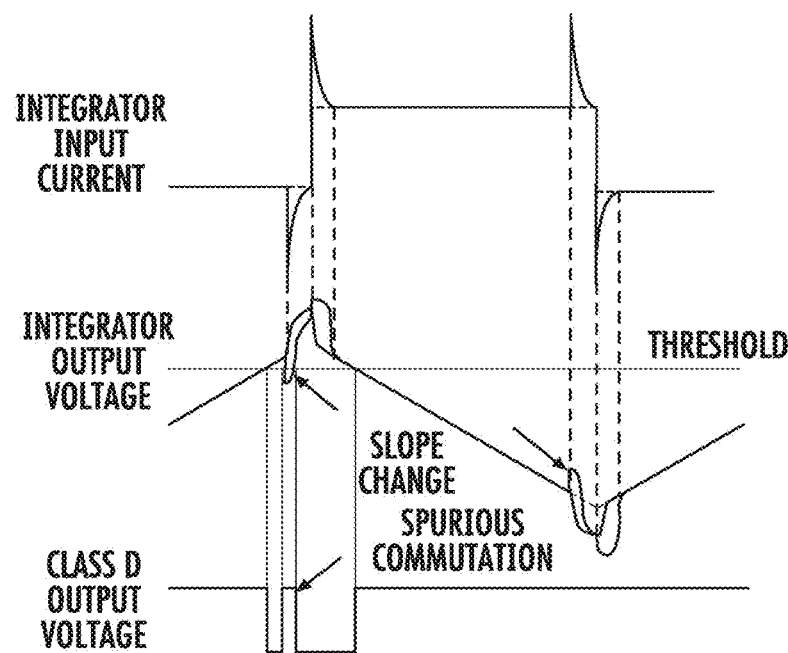

In this way, the problem of possible spurious switching due to slope variations in the triangular waveform produced in PWM modulators, discussed in relation to the first circuit embodiment of FIG. 3 and depicted in FIG. 7, may be reduced.

Pulse width modulation in systems with negative feedback loops like class D amplifiers, just to mention a typical example, may not typically require that the triangular wave be very precise specially in the region near saturation of the dynamic range of modulation. Resiliency against near clipping disturbances, that is in the operating zone most sensitive to noise, by deliberately creating a synchronous broad peak at the vertexes of the triangular waveform, practically prolonging the cusp, is effectively enhanced. Different possible circuit implementations of the method are disclosed including a simplified embodiment whereby such an effective synchronous peak at vertexes is created by shifting in opposite directions the upward and the downward slopes of the triangular waveform.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure and modifications and/or additions may be made by those skilled in the art to the herein above disclosed basic embodiment while remaining within the scope of the following claims.

What is claimed is:

1. A pulse width modulation (PWM) modulator, comprising:
   an integrator configured to:
      receive a modulating signal and a square wave carrier signal;
      modulate the square wave carrier signal based on the modulating signal, the square wave carrier signal having a frequency greater than a frequency of the modulating signal; and
      output a triangular waveform comprising a downward slope, an upward slope, and a step discontinuity connecting an end of the downward slope to a beginning of the upward slope; and
   a comparator configured to compare the triangular waveform with a threshold and output a PWM modulated square wave carrier signal, wherein the integrator comprises a negative feedback loop coupled between an output of the integrator and an input terminal of the integrator, the negative feedback loop comprising:
      an integrating capacitor; and
      a resistor coupled in series with the integrating capacitor, the resistor having a resistance configured to cancel a right hand side zero of a transfer function of the integrator.

2. The PWM modulator of claim 1, wherein the integrator comprises an operational amplifier.

3. The PWM modulator of claim 2, wherein the operational amplifier comprises a class D amplifier.

4. The PWM modulator of claim 1, wherein the integrator has a drain output configuration.

5. The PWM modulator of claim 1, wherein a frequency of the square wave carrier signal is configured to be at least one order of magnitude greater than a frequency of the modulating signal.

6. The PWM modulator of claim 1, wherein the input terminal of the integrator comprises an inverting input of the integrator.

7. The PWM modulator of claim 6, wherein the modulating signal and the square wave carrier signal are received at the inverting input of the integrator.

8. The PWM modulator of claim 1, wherein a magnitude of the step discontinuity is proportional to an amplitude of the square wave carrier signal.

9. A pulse width modulation (PWM) modulator, comprising:
   an operational amplifier comprising a first input terminal, a second input terminal, and an output terminal;
   a capacitive element having a first terminal tied to the first input terminal;
   a resistive element having a first terminal tied to a second terminal of the capacitive element, the resistive element further having a second terminal tied to the output terminal of the operational amplifier;
   a carrier signal generator configured to generate a carrier signal, wherein the first input terminal of the operational amplifier is configured to receive the carrier signal;
   a modulator configured to generate a modulating signal, the carrier signal having a frequency greater than a frequency of the modulating signal, wherein the first input terminal of the operational amplifier is configured to receive the modulating signal, and wherein the output terminal of the operational amplifier is configured to generate a triangular waveform; and
   a comparator configured to compare the triangular waveform with a threshold and output a PWM modulated carrier signal.

10. The PWM modulator of claim 9, wherein the triangular waveform comprises a downward slope, an upward slope, and a step discontinuity connecting an end of the downward slope to a beginning of the upward slope.

11. The PWM modulator of claim 10, wherein a magnitude of the step discontinuity is proportional to an amplitude of the carrier signal.

12. The PWM modulator of claim 9, wherein the carrier signal comprises a square wave carrier signal.

13. The PWM modulator of claim 12, wherein a voltage across the resistive element is configured to track a waveform of the square wave carrier signal, and wherein a voltage across the capacitive element is configured to track an integration of the waveform of the square wave carrier signal.

14. The PWM modulator of claim 9, wherein the operational amplifier comprises a class D amplifier.

15. The PWM modulator of claim 9, wherein a frequency of the carrier signal is configured to be at least one order of magnitude greater than a frequency of the modulating signal.

16. A pulse width modulation (PWM) modulator comprising:
   an operational amplifier, a negative feedback circuit coupled between an input terminal of the operational amplifier and an output terminal of the operational amplifier, and a comparator coupled to the output terminal, the PWM modulator configured to:
      receive a square wave carrier signal and a modulating signal at the input terminal of the operational amplifier,
      generate, across a capacitor in the negative feedback circuit, a triangle waveform based on the square wave carrier signal and the modulating signal received,
      generate, across a resistor in the negative feedback circuit, a square-wave signal that tracks a waveform of the square wave carrier signal, wherein the resistor is coupled in series with the capacitor; and
      generate a synchronous peak at one or more vertexes of the triangle waveform to form a triangular waveform comprising a downward slope, an upward slope, and a step discontinuity connecting an end of the downward slope to a beginning of the upward slope.

17. The PWM modulator of claim 16, wherein a magnitude of the step discontinuity is proportional to an amplitude of the square wave carrier signal.

18. The PWM modulator of claim 16, wherein a frequency of the square wave carrier signal is greater than a frequency of the modulating signal.

19. The PWM modulator of claim 18, wherein the frequency of the square wave carrier signal is configured to be at least one order of magnitude greater than the frequency of the modulating signal.

20. The PWM modulator of claim 16, wherein the input terminal of the operational amplifier comprises an inverting input of the operational amplifier.

21. The PWM modulator of claim 16, wherein the resistor comprises a resistance configured to cancel a right hand side zero of a transfer function of the operational amplifier.

* * * * *